(12) United States Patent
Nakabayashi

(10) Patent No.: US 7,109,536 B2
(45) Date of Patent: Sep. 19, 2006

(54) MEMORY EMBEDDED SEMICONDUCTOR DEVICE AND METHOD FOR FABRICATING THE SAME

(75) Inventor: Takashi Nakabayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/979,222

(22) Filed: Nov. 3, 2004

(65) Prior Publication Data

US 2005/0101076 A1    May 12, 2005

(30) Foreign Application Priority Data

Nov. 7, 2003    (JP) ............... 2003-378407

(51) Int. Cl.
H01L 21/76    (2006.01)
(52) U.S. Cl. .................. 257/290; 257/296; 257/412
(58) Field of Classification Search ........ 438/585–595, 438/275–277; 257/412–413, 296, 290
See application file for complete search history.

(56) References Cited

U.S. PATENT DOCUMENTS 4,689,667 A * 8/1987 Aronowitz .............. 257/607
4,697,333 A * 10/1987 Nakahara .............. 438/301

FOREIGN PATENT DOCUMENTS

| JP | 7-94596 | 4/1995 |
| JP | 2000-332220 | 11/2000 |
| JP | 2001-127270 | 5/2001 |
| JP | 2003536862 | * 5/2003 |

* cited by examiner

Primary Examiner—Richard A. Booth
(74) Attorney, Agent, or Firm—McDermott Will & Emery LLP

(57) ABSTRACT

A memory embedded semiconductor device according to the present invention has a memory region having a memory transistor and a logic region having a logic transistor each provided in a common semiconductor substrate. The logic transistor has a gate electrode provided on the semiconductor substrate and source/drain diffusion layers formed in the semiconductor substrate each having a silicide film formed thereon. On the other hand, the memory transistor has a gate electrode provided on the semiconductor substrate and source/drain diffusion layers formed in the semiconductor substrate each having a silicide film formed thereon to be thinner than the silicide film formed on each of the source/drain diffusion layers of the logic transistor.

12 Claims, 3 Drawing Sheets

MEMORY EMBEDDED SEMICONDUCTOR DEVICE AND METHOD FOR FABRICATING THE SAME

CROSS-REFERENCE TO RELATED APPLICATIONS

This application claims priority under 35 U.S.C. §119 on patent application Ser. No. 2003-378407 filed in Japan on Nov. 7, 2003, the entire contents of which are hereby incorporated by reference.

BACKGROUND OF THE INVENTION

The present invention relates to a memory embedded semiconductor device comprising a memory such as a DRAM or a ROM and a high-speed CMOS logic circuit.

A DRAM embedded LSI is an LSI having a memory region and a logic region each provided in a common substrate and suitable for processing a large amount of data at a high speed due to the structural feature thereof which allows a wider data bus to be provided between the memory and logic regions. In addition, the DRAM embedded LSI need not use wiring provided on a printed circuit board or the like which is located outside of the LSI package. This achieves a reduction in the power consumption of a system and renders the DRAM embedded LSI extremely effective as a system LSI.

To enhance the performance of a transistor (logic transistor) in the logic region of the DRAM embedded LSI, it is necessary to reduce the parasitic resistance of the transistor by using a salicide technology. However, since a shallow junction is used in each of the source/drain regions of a transistor (memory transistor) provided in the memory region with the view to suppressing a short channel effect, a leakage current to the substrate increases when a silicide layer is formed on each of the source/drain regions of the memory transistor so that a charge retention time (pause time) is shortened. A description will be given herein below to the structures of conventional DRAM embedded LSIs and fabrication methods therefor with reference to the drawings.

CONVENTIONAL EMBODIMENT 1

FIG. 3 shows a cross-sectional structure of a memory embedded semiconductor device (DRAM embedded LSI) according to a first conventional embodiment disclosed in Japanese Laid-Open Patent Publication No. 2000-332220 (Abstract).

As shown in the drawing, a memory embedded semiconductor device according to the first conventional embodiment has a logic region Rlogc comprising logic transistors and a DRAM region Rdram comprising the transistors of DRAM memory cells (memory transistors) disposed in a common semiconductor substrate 100. Although the logic transistors include a p-channel transistor and an n-channel transistor, the drawing shows only the n-channel transistor. The drawing also shows the structure in which n-channel transistors are used as the memory transistors.

The logic transistor comprises: a gate insulating film 102 and a gate electrode 103 each provided on an active region surrounded by isolations (trench isolations) 101; source/drain diffusion layers 104 formed in the regions of the semiconductor substrate 100 located sidewise of the gate electrode 103; and sidewalls 105 covering the side surfaces of the gate electrode 103. The gate electrode 103 is composed of a lower electrode 103a made of polysilicon containing an n-type impurity and an upper electrode 103b made of silicide. The upper electrode 103b is formed simultaneously with source/drain silicide layers 106 formed on the source/drain diffusion layers 104 by a common salicide process step.

Each of the memory transistors comprises: a gate insulating film 112 and a gate electrode 113 each provided on an active region surrounded by the isolations (trench isolations) 101; source/drain diffusion layers 114 formed in the regions of the semiconductor substrate 100 located sidewise of the gate electrode 113; and sidewalls 115 covering the side surfaces of the gate electrode 113. The gate electrode 113 is composed of a lower electrode 113a made of polysilicon containing an n-type impurity and an upper electrode 113b made of silicide. It is to be noted that source/drain suicide layers are not provided in the memory transistor.

CONVENTIONAL EMBODIMENT 2

FIG. 4 shows a cross-sectional structure of a memory embedded semiconductor device according to a second conventional embodiment disclosed in Japanese Laid-Open Patent Publication No. 2001-127270 (Abstract), which allows the higher-speed operation of the memory transistors.

As shown in the drawing, the memory embedded semiconductor device according to the second conventional embodiment has a logic region Rlogc and a DRAM region Rdram disposed in a common semiconductor substrate 200 in the same manner as in the first conventional embodiment.

A logic transistor comprises: a gate insulating film 202 and a gate electrode 203 each provided on an active region surrounded by isolations (trench isolations) 201; source/drain diffusion layers 204 formed in the regions of the semiconductor substrate 200 located sidewise of the gate electrode 203; and sidewalls 205 covering the side surfaces of the gate electrode 203. The gate electrode 203 is composed of a lower electrode 203a made of polysilicon containing an n-type impurity and an upper electrode 203b made of silicide. The upper electrode 203b is formed simultaneously with source/drain silicide layers 206 formed on the source/drain diffusion layers 204 by a common salicide process step.

On the other hand, a memory transistor comprises: a gate insulating film 212 and a gate electrode 213 each provided on an active region surrounded by the isolations (trench isolations) 201, source/drain diffusion layers 214 formed in the regions of the semiconductor substrate 200 located sidewise of the gate electrode 213; and sidewalls 215 covering the side surfaces of the gate electrode 213. The gate electrode 213 is composed of a lower electrode 213a made of polysilicon containing an n-type impurity and an upper electrode 213b made of silicide. The upper electrode 213b is formed simultaneously with source/drain silicide layers 216 formed on the source/drain diffusion layers 214 by a common salicide process step.

In the memory embedded semiconductor device according to the first conventional embodiment, a junction leakage can be reduced and an impurity concentration in each of the source/drain diffusion layers 114 can be reduced because the silicide layer is not formed on either of the source/drain diffusion layers 114 of the memory transistor. This provides a memory transistor with an excellent short-channel effect (with a reduced off leakage). As a result, it becomes possible to implant a logic transistor operable at a high speed, while suppressing a reduction in pause time.

In recent years, however, an ultra-high-speed operation at about 200 MHz has been requested of a memory as a replacement of an SRAM in the DRAM embedded LSI. In the memory embedded semiconductor device (DRAM embedded LSI) according to the first conventional embodiment, the problem is encountered that it is difficult to allow a high-speed operation because of the high parasitic resistance of each of the source/drain diffusion layers of the memory transistor.

By contrast, the silicide layer 216 is formed on each of the source/drain diffusion layers 214 of the memory transistor in the memory embedded semiconductor device according to the second conventional embodiment. The arrangement has achieved an impurity concentration equal to that in the logic transistor in each of the source/drain diffusion layers 214. A resulting reduction in parasitic resistance due to the silicide allows the higher-speed operation of the memory transistor and thereby implements a high-speed memory operation.

In the memory embedded semiconductor device according to the second conventional embodiment, however, the memory transistor is allowed to have only a leakage characteristic as low as that of the logic transistor so that the pause time is shortened, though the memory operation is performed. Accordingly, it becomes necessary to increase the number of times data refreshing is performed so that power consumption is increased. As a result, the problem is encountered that it is difficult to embed a DRAM having a memory capacity over 10 Mbits in terms of power consumption, though the embedding of a DRAM having a memory capacity of about 1 to 2 Mbits presents no serious problem.

SUMMARY OF THE INVENTION

It is therefore an object of the present invention to solve the foregoing conventional problems and implement a high-speed, large-capacity, and low-power memory embedded semiconductor device and a fabrication method therefor by reducing a leakage in a memory transistor and allowing the higher-speed operation thereof, while retaining the performance of a logic transistor.

To attain the object, a memory embedded semiconductor device according to the present invention has a silicide film provided on each of the source/drain diffusion layers of a memory transistor which is thinner than a silicide film provided on each of the source/drain diffusion layers of a logic transistor.

Specifically, a first memory embedded semiconductor device according to the present invention comprises: a memory region having a memory transistor and a logic region having a logic transistor each provided in a common semiconductor substrate, wherein the logic transistor comprises: a gate electrode formed on the semiconductor substrate; and source/drain diffusion layers each formed in the semiconductor substrate and having a silicide film formed thereon and the memory transistor comprises: a gate electrode formed on the semiconductor substrate; and source/drain diffusion layers each formed in the semiconductor substrate and having a silicide film formed thereon to be thinner than the silicide film formed on each of the source/drain diffusion layers of the logic transistor.

The memory embedded semiconductor device according to the present invention achieves reductions in a leakage to the substrate and a parasitic resistance in the memory transistor without degrading the performance of the logic transistor and thereby prevents a reduction in pause time. As a result, it becomes possible to implement a low-power and large-capacity memory embedded semiconductor device operable at a high speed.

In the memory embedded semiconductor device according to the present invention, the gate electrode of the logic transistor preferably has a polysilicon film and a silicide film formed on the polysilicon film and the gate electrode of the memory transistor preferably has a polysilicon film and a silicide film formed on the polysilicon film to be thinner than the silicide film formed on the polysilicon film of the logic transistor. The arrangement achieves a reduction in the parasitic resistance of the gate electrode not only in the logic transistor but also in the memory transistor so that it becomes possible to implement a memory embedded semiconductor device operating at a higher speed.

In the memory embedded semiconductor device according to the present invention, an impurity selected from nitrogen, argon, neon, arsenic, silicon, and germanium has preferably been implanted in each of the source/drain diffusion layers of the memory transistor. The arrangement allows reliable adjustment of the thickness of the silicide film formed in the memory transistor to be smaller than the thickness of the silicide film formed in the logic transistor.

In the memory embedded semiconductor device according to the present invention, the memory region is preferably a DRAM or a ROM.

A first method for fabricating a memory embedded semiconductor device according to the present invention is a method for fabricating a memory embedded semiconductor device comprising a memory region having a memory transistor and a logic region having a logic transistor each provided in a common semiconductor substrate, the method comprising the steps of: (a) forming source/drain diffusion layers of each of the memory transistor and the logic transistor in the semiconductor substrate; (b) implanting ions of an impurity for suppressing a silicide reaction at least into each of the source/drain diffusion layers of the memory transistor by using an implant mask covering the logic region; and (c) forming a silicide film on each of the source/drain diffusion layers of each of the logic transistor and the memory transistor with the implant mask having been removed, wherein the silicide film formed on each of the source/drain diffusion layers of the memory transistor is thinner than the silicide film formed on each of the source/drain diffusion layers of the logic transistor.

The first method for fabricating a memory embedded semiconductor device can suppress a silicide reaction in each of the source/drain diffusion layers of the memory transistor. Accordingly, the thickness of the silicide film formed on each of the source/drain diffusion layers of the memory transistor can be adjusted to be smaller than the thickness of the silicide film formed on each of the source/drain diffusion layers of the logic transistor. As a result, it becomes possible to fabricate a lower-power memory transistor operating at a high speed and having a reduced leakage to the substrate and a reduced parasitic resistance without degrading the performance of the logic transistor.

In the first method for fabricating a semiconductor device, the step (a) preferably includes further forming, on the semiconductor substrate, polysilicon films having exposed upper surfaces and forming the respective gate electrodes of the memory transistor and the logic transistor, the step (b) preferably includes implanting the ions of the impurity for suppressing a silicide reaction also in the polysilicon film forming the gate electrode of the memory transistor, the step (c) preferably includes forming a silicide film also on each of the polysilicon films forming the respective gate electrodes of the logic transistor and the memory transistor, and the silicide film formed on the polysilicon film forming the gate electrode of the memory transistor is preferably thinner than the silicide film formed on the polysilicon film forming the gate electrode of the logic transistor.

The arrangement allows the silicidation of the gate electrode not only in the logic transistor but also in the memory transistor so that the parasitic resistance is reduced reliably. As a result, it becomes possible to fabricate a higher-speed memory embedded semiconductor device.

In the first method for fabricating a memory embedded semiconductor device according to the present invention, the ions of the impurity for suppressing a silicide reaction are preferably ions of an impurity selected from nitrogen, argon, neon, arsenic, silicon, and germanium. The arrangement can reliably suppress silicidation in the memory region and allows the adjustment of the thickness of the silicide film formed in the memory region to be smaller than the thickness of the silicide film formed in the logic region.

A second method for fabricating a memory embedded semiconductor device according to the present invention is a method for fabricating a memory embedded semiconductor device comprising a memory region having a memory transistor and a logic region having a logic transistor each provided in a common semiconductor substrate, the method comprising the steps of: (a) forming source/drain diffusion layers of each of the memory transistor and the logic transistor in the semiconductor substrate; (b) forming an insulating film for suppressing a silicide reaction covering at least each of the source/drain diffusion layers of the memory transistor and having an opening over the logic region; and (c) depositing a metal film over each of the logic region and the memory region with the insulating film for suppressing a silicide reaction being formed to form a silicide film through silicidation on each of the source/drain diffusion layers of each of the logic transistor and the memory transistor, wherein the silicide film formed on each of the source/drain diffusion layers of the memory transistor is thinner than the silicide film formed on each of the source/drain diffusion layers of the logic transistor.

The second method for fabricating a memory embedded semiconductor device can suppress a silicide reaction in the memory region. Accordingly, the thickness of the silicide film formed on each of the source/drain diffusion layers of the memory transistor can be adjusted to be smaller than the thickness of the silicide film formed on each of the source/drain diffusion layers of the logic transistor. As a result, it becomes possible to fabricate a memory embedded semiconductor device comprising a lower-power memory transistor operating at a high speed and having a reduced leakage to the substrate and a reduced parasitic resistance without degrading the performance of the logic transistor.

In the second method for fabricating a semiconductor device, the step (a) preferably includes further forming, on the semiconductor substrate; polysilicon films having exposed upper surfaces and forming the respective gate electrodes of the memory transistor and the logic transistor, the step (b) preferably includes forming the insulating film for suppressing a silicide reaction also on the polysilicon film forming the gate electrode of the memory transistor, the step (c) preferably includes forming a silicide film also on each of the polysilicon films forming the respective gate electrodes of the logic transistor and the memory transistor, and the silicide film formed on the polysilicon film forming the gate electrode of the memory transistor is preferably thinner than the silicide film formed on the polysilicon film forming the gate electrode of the logic transistor.

The arrangement allows the silicidation of the gate electrode not only in the logic transistor but also in the memory transistor so that the parasitic resistance is reduced reliably. As a result, it becomes possible to fabricate a higher-speed memory embedded semiconductor device.

In the second method for fabricating a memory embedded semiconductor device, the insulating film for suppressing a silicide reaction is preferably an oxide film. The arrangement can reliably suppress silicidation in the memory region and allows the adjustment of the thickness of the silicide film formed in the memory region to be smaller than the thickness of the silicide film formed in the logic region.

Thus, the memory embedded semiconductor device and the fabrication method therefor according to the present invention allows a reduction in leakage in the memory transistor and the higher-speed operation thereof, while retaining the performance of the logic transistor and implements a high-speed, large-capacity, and low-power memory embedded semiconductor device and a fabrication method therefor.

DESCRIPTION OF THE PREFERRED EMBODIMENTS

Embodiment 1

Figure 1A:
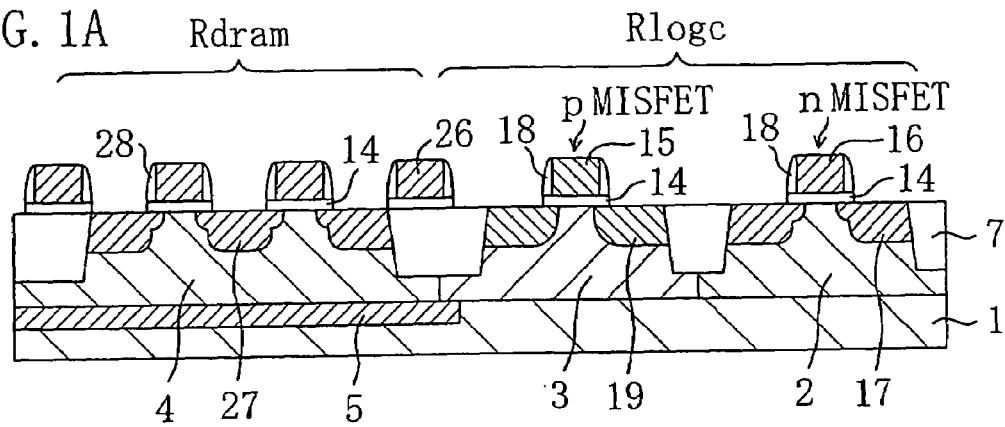
FIGS. 1A to 1D are cross-sectional views illustrating the process steps of fabricating a memory embedded semiconductor device according to a first embodiment of the present invention.

FIGS. 1A to 1D show the cross-sectional states of a DRAM embedded semiconductor device according to a first embodiment of the present invention in the individual process steps of a fabrication method therefor. As shown in the drawings, the memory embedded semiconductor device according to the first embodiment has a logic region Rlogc comprising logic transistors and a memory region Rdram comprising transistors (memory transistors) each as a part of a DRAM memory cell, which are disposed in a common semiconductor substrate 1. The drawings show a structure in which both a p-channel transistor (pMISFET) and an n-channel transistor (nMISFET) are used as the logic transistors and n-channel transistors are used as the memory transistors.

First, in the step shown in FIG. 1A, isolation regions 7 (STIs) each defining an active region are formed in the surface regions of the semiconductor substrate 1 doped with a p-type impurity. Then, a p-type well region 2, an n-type well region 3, a triple p-type well region 4, and an n-type buried diffusion region 5 are formed at predetermined positions by a well-known method. It is to be noted that the n-type buried diffusion region 5 need not necessarily be formed.

Next, a gate insulating film 14 composed of a thermal oxide film is formed on the active region of the semiconductor substrate and then a polysilicon film is deposited on the gate insulating film 14. After ions of an n-type impurity (such as phosphorus) are implanted in the regions of the polysilicon film serving as the gate electrodes of nMISFETs, the polysilicon film is patterned to form a polysilicon film 15 forming the lower electrode of the pMISFET in the logic region Rlogc, a polysilicon film 16 forming the lower electrode of each of the nMISFETs in the logic region Rlogc, and the polysilicon film 26 forming the lower electrode of the nMISFET in the memory region Rdram.

Next, boron ions (B$^+$) are implanted at an acceleration voltage of 3 keV and a dose of 1×10$^{14}$ cm$^{-2}$ by using a resist film (not shown) covering the region of the logic region Rlogc to be formed with the nMISFET and the memory region Rdram, thereby forming the extension region of the pMISFET of the logic region Rlogc in the n-type well region 3.

On the other hand, arsenic ions (As$^+$) are implanted at an acceleration voltage of 5 keV and a dose of 1×10$^{14}$ cm$^{-2}$ by using a resist film (not shown) covering the region of the logic region Rlogc to be formed with the pMISFET and the memory region Rdram, thereby forming the extension region of the nMISFET of the logic region Rlogc in the p-type well region 2.

Additionally, phosphorus ions (P$^+$) are implanted at an acceleration voltage of 5 keV and a dose of 5×10$^{13}$ cm$^{-2}$ by using a resist film (not shown) covering the logic region Rlogc, thereby forming LDD (Lightly Doped Drain) regions for the memory transistors (nMISFETs) in the triple p-type well region 4. Thereafter, an insulating film for sidewalls is deposited on the substrate and subjected to anisotropic etching, thereby forming sidewalls 18 on the respective side surfaces of the polysilicon films 15 and 16, while forming sidewalls 28 on the side surfaces of the polysilicon film 26.

Next, boron ions (B$^+$) are implanted at an acceleration voltage of 5 keV and a dose of 4×10$^{15}$ cm$^{-2}$ by using a resist film (not shown) covering the region of the logic region Rlogc to be formed with the nMISFET and the memory region Rdram, thereby forming the heavily doped source/drain regions of the pMISFET in the logic region Rlogc.

On the other hand, arsenic ions (As$^+$) are implanted at an acceleration voltage of keV and a dose of 4×10$^{15}$ cm$^{-2}$ by using a resist film (not shown) covering the region of the logic region Rlogc to be formed with the pMISFET and the memory region Rdram, thereby forming the heavily doped source/drain regions of the nMISFET in the logic region Rlogc.

Next, arsenic ions (As$^+$) are implanted at an acceleration voltage of 10 keV and a dose of 4×10$^{14}$ cm$^{-2}$ by using a resist film (not shown) covering the logic region Rlogc, thereby amorphizing the surface portion of the triple p-type well region 4 for the prevention of channeling. Then, phosphorus ions (P$^+$) are implanted at an acceleration voltage of 10 keV and a dose of 4×10$^{15}$ cm$^{-2}$, thereby forming the heavily doped source/drain regions of the memory transistors (nMISFETs).

Thereafter, a thermal treatment (Rapid Thermal Annealing: RTA) is performed at a temperature of 1050° C. for 10 seconds to activate the impurities implanted in the individual ion implantation steps, thereby forming the respective source/drain diffusion layers 17, 19, and 27 of the individual MISFETs and changing the polysilicon film 15 into the p-type gate electrode, while changing the polysilicon films 16 and 26 into the respective n-type gate electrodes.

Although the present embodiment has performed the implantation of the ions in each of the nMISFETs in the logic region and the memory region under different ion implantation conditions by using the different resist masks, the simultaneous process may also be performed under the same implant conditions by using the same resist mask.

Figure 1B:
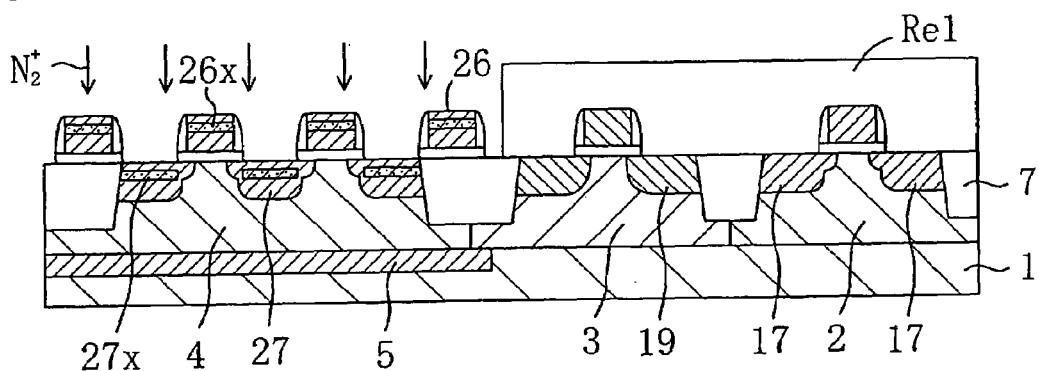

Next, in the step shown in FIG. 1B, nitrogen molecular ions (N$_2$$^+$) for suppressing a silicide reaction are implanted selectively only in the memory region Rdram at an acceleration voltage of 10 keV and a dose of 1×10$^{15}$ cm$^{-2}$ by using the resist film Re1 covering the logic region Rlogc, thereby forming respective ion implanted regions 27x and 26x each as an amorphous layer in the source/drain diffusion layers 27 and 26. At this time, the depth from the upper surface of each of the source/drain diffusion layers 27 and the polysilicon film 26 to the upper surface of each of the ion implanted regions 27x and 26x is adjusted to about 20 nm.

The same effects are obtainable if ions of Ar, Ne, As, Si, Ge, or the like are implanted instead of the nitrogen molecular ions (N$_2$$^+$). The proper ranges of the ion implantation conditions are such that the acceleration voltage is 5 keV to 30 keV and the dose is 5×10$^{14}$ cm$^{-2}$ to 5×10$^{15}$ cm$^{-2}$.

Figure 1C:
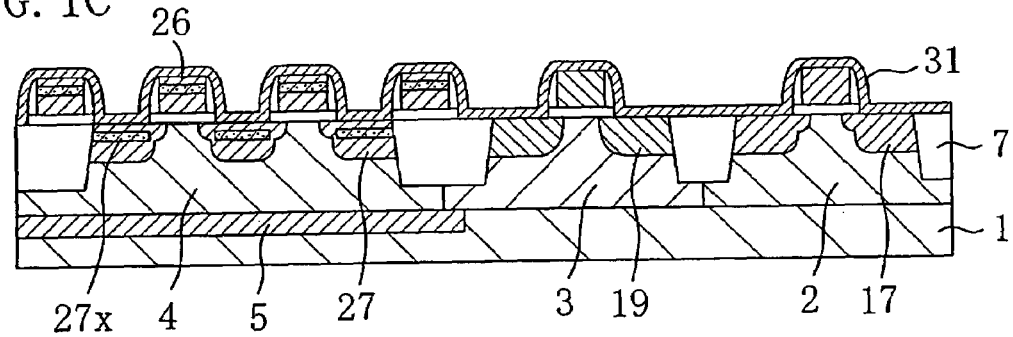

Next, in the step shown in FIG. 1C, a cobalt film 31 with a thickness of 10 μm is deposited on the substrate.

Figure 1D:
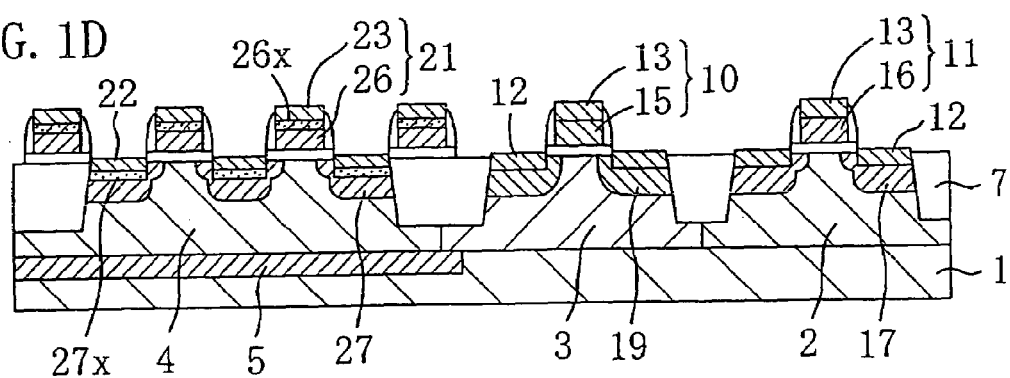

Next, in the step shown in FIG. 1D, a thermal process is performed at a temperature of 600° C. for about 30 minutes, thereby causing a reaction between silicon and cobalt and forming a silicide film. Then, unreacted cobalt is removed by using a solution mixture (SPM) of a sulfuric acid and an aqueous hydrogen peroxide. Thereafter, a thermal treatment is performed at a temperature of 750° C. for about 30 minutes, thereby forming a cobalt silicide film forming the upper electrode of the gate electrode of each of the MISFETs and a part of each of the source/drain regions thereof.

In the logic region Rlogc, the gate electrode 10 of the pMISFET is therefore composed of the p-type polysilicon film 15 as the lower electrode and the silicide film 13 as the upper electrode, while the gate electrode 11 of the nMISFET is composed of the n-type polysilicon film 16 as the lower electrode and the silicide film 13 as the upper electrode. The source/drain regions of the pMISFET are composed of the p-type source/drain diffusion layers 19 and the silicide films 12, while the source/drain regions of the nMISFET are composed of the n-type source/drain diffusion layers 17 and the silicide films 12.

In the memory region Rdram, on the other hand, the gate electrode 21 of each of the memory transistors is composed of the n-type polysilicon film 26 including the ion implanted region 26x as the lower electrode and the silicide film 23 as the upper electrode. The source/drain regions of the memory transistor are composed of the n-type source/drain diffusion layers 27 including the ion implanted region 27x and the silicide film 22.

Thereafter, the steps of forming an interlayer insulating film on the substrate, forming respective plugs reaching the source/drain regions, forming a DRAM capacitor on the interlayer insulating film in the memory region Rdram, and forming a multilevel wiring layer insulated by the interlayer insulating film are subsequently performed, though the depiction thereof is omitted, whereby the memory embedded semiconductor device is formed. Although the present embodiment has formed the DRAM as the memory region, it is also possible to form a ROM or the like instead of the DRAM.

In accordance with the method for fabricating a semiconductor device of the present embodiment, the ion implanted regions 27x and 26x each composed of an amorphous layer formed in the step shown in FIG. 1B inhibit the diffusion of cobalt in each of the gate electrode and source/drain diffusion layers of the memory transistor so that a silicide reaction is suppressed.

Since each of the ion implanted regions 27x and 26x formed in the present embodiment is positioned at a depth of about 20 nm, a relatively thick cobalt silicide film with a thickness of about 30 nm can be formed on each of the source/drain diffusion layers 17 and 19 of the logic transistors and a relatively thin cobalt silicide film with a limited thickness of about 20 nm can be formed on each of the source/drain diffusion layers 27 of the memory transistors. As a result, the junction is substantially deepened in each of the memory transistors so that a junction leakage to the substrate is suppressed in the memory transistor. At the same time, cobalt silicide spike resulting from an abnormal reaction can be suppressed in the logic region Rlogc.

Thus, the fabrication method according to the present embodiment has implanted nitrogen molecular ions for suppressing a silicide reaction or the like only in the memory transistors to form the amorphized ion implanted regions in the regions each at a predetermined depth from the surface and then performed silicidation in each of the memory region Rdram and the logic region Rlogc by using a salicide technology. Since the ion implanted regions suppress a silicide reaction in the source/drain diffusion layers of the memory transistors, it becomes possible to reduce the thickness of the silicide film of each of the memory transistors, while increasing the thickness of the silicide film of each of the logic transistors. This allows a reduction in junction leakage in the memory transistors and the higher-speed operation thereof, while retaining the conventional performance of the logic transistors in the memory embedded semiconductor device.

In the case where the thickness of such a silicide film is suppressed in a transistor having a dual gate electrode composed of an n-type polysilicon layer and a p-type polysilicon layer, such as a logic transistor, the silicide film on the boundary region between the n-type polysilicon layer and the p-type polysilicon layer is abnormally thinned at the gate electrode portion so that there are concerns about the agglomeration of crystal grains which occurs in the silicide film when a thermal process is performed.

However, the present embodiment has thinned the silicide film only in each of the transistors in the memory region composed of DRAM memory cells or ROM memory cells each using a gate electrode of one conductivity type (which is normally an n-type). Accordingly, there is no boundary region between the n-type polysilicon layer and the p-type polysilicon layer so that the abnormal thinning of the silicide film does not occur. This allows the higher-speed operation of the memory embedded semiconductor device without affecting the reliability thereof.

Embodiment 2

FIGS. 2A to 2D show the cross-sectional states of a DRAM embedded semiconductor device according to a second embodiment of the present invention in the individual process steps of a fabrication method therefor. As shown in the drawings, the memory embedded semiconductor device according to the second embodiment has a logic region Rlogc comprising logic transistors and a DRAM region Rdram comprising transistors (memory transistors) each as a part of a DRAM memory cell, which are disposed in a common semiconductor substrate 1 in the same manner as in the first embodiment. The drawings show a structure in which both a p-channel transistor (pMISFET) and an n-channel transistor (nMISFET) are used as the logic transistors and n-channel transistors are used as the memory transistors.

Figure 2A:
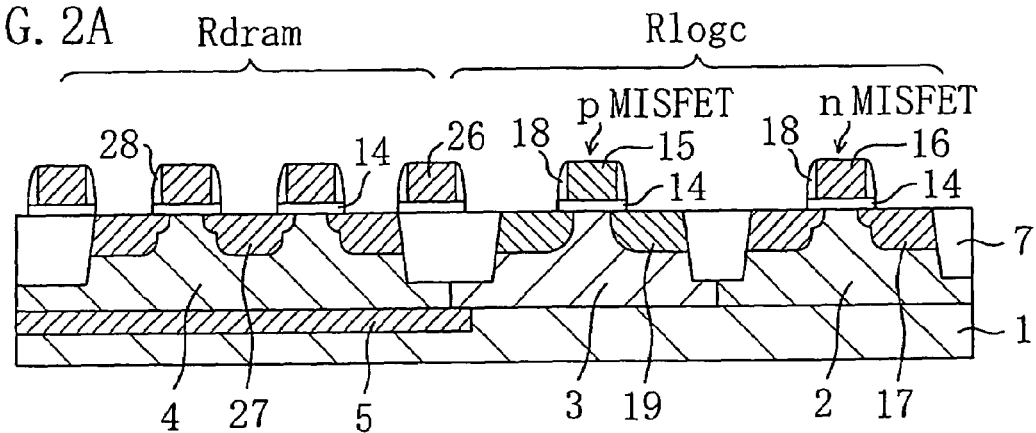
FIGS. 2A to 2D are cross-sectional views illustrating the process steps of fabricating a memory embedded semiconductor device according to a second embodiment of the present invention.

First, the same process as illustrated in FIG. 1A is performed in the step shown in FIG. 2A by the procedure described in the first embodiment so that isolation regions 7 (STIs), a p-type well region 2, an n-type well region 3, a triple p-type well region 4, an n-type buried diffusion region 5, a gate insulating film 14, the respective polysilicon films 15, 16, and 26 of the individual MISFETs, the respective sidewalls 18 and 28 of the individual MISFETs, and the respective source/drain diffusion layers 17, 19, and 27 of the individual MISFETs are formed, as shown in FIG. 2A.

Figure 2B:
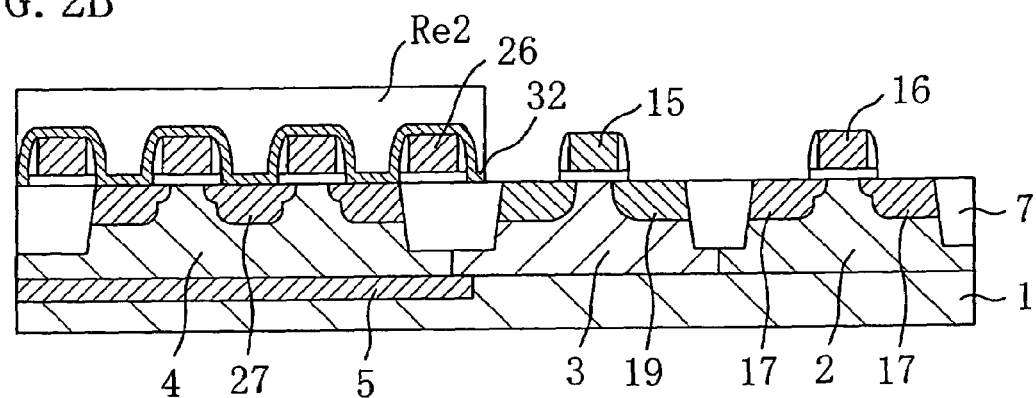

Next, in the step shown in FIG. 2B, an oxide film 32 with a thickness of about 1 nm is formed on the silicon layer exposed on the substrate by an oxidation process using an oxygen plasma. Instead of the oxidation process using the oxygen plasma, it is also possible to use a normal thermal oxidation process, a native-oxide-film formation process subsequent to a wet process, a CVD process, or the like to form the oxide film 32. Then, the portion of the oxide film 32 located in the region other than the memory region Rdram is selectively removed by wet etching using a resist film Re2 covering the memory region Rdram.

Figure 2C:
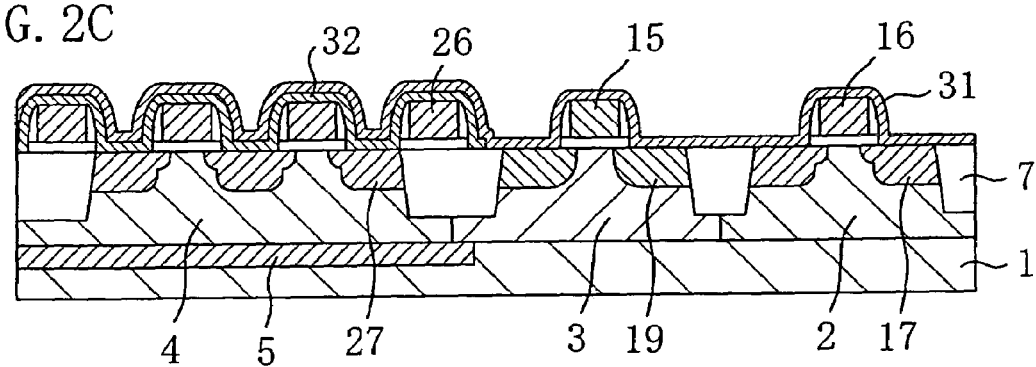

Next, in the step shown in FIG. 2C, a cobalt film 31 with a thickness of 10 nm is deposited to cover the surface of the substrate exposed in the logic region Rlogc and cover the oxide film 32 in the memory region Rdram.

Figure 2D:
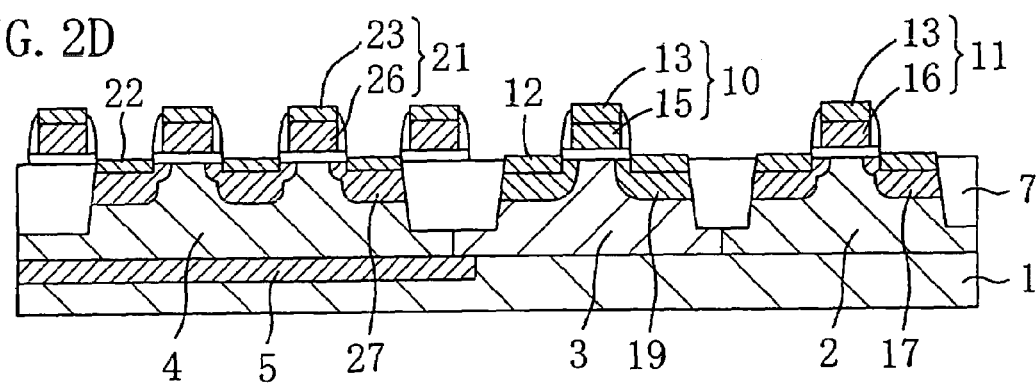
Figure 3:
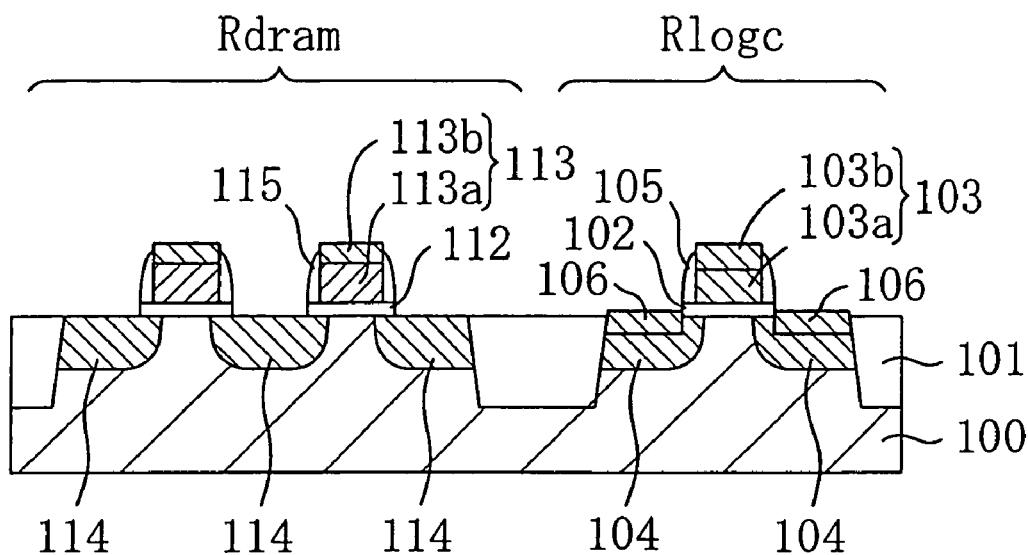
FIG. 3 is a cross-sectional view showing a structure of a memory embedded semiconductor device according to a first conventional embodiment.
Figure 4:
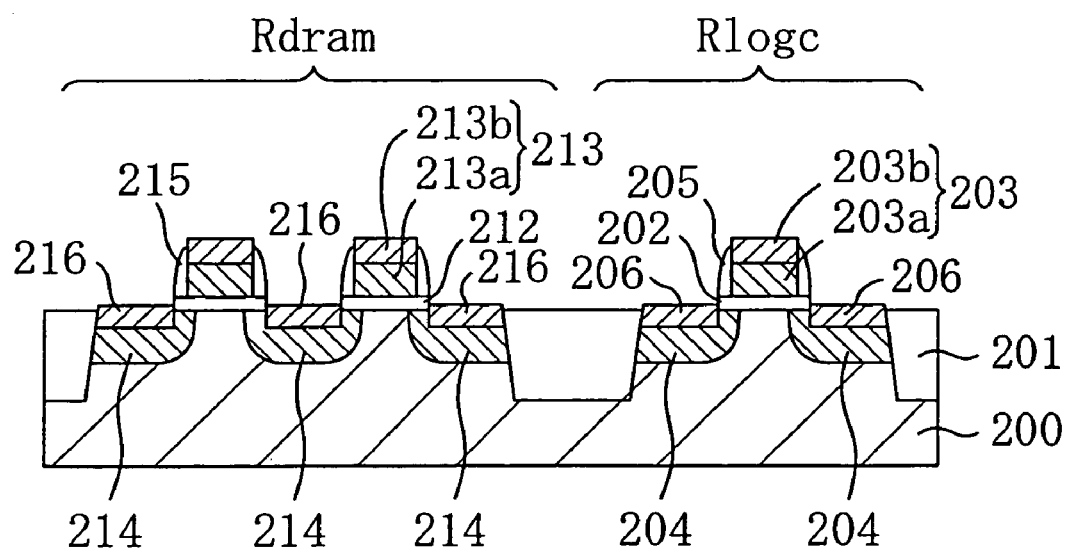
FIG. 4 is a cross-sectional view showing a structure of a memory embedded semiconductor device according to a second conventional embodiment.

Next, in the step shown in FIG. 2D, a thermal process is performed at a temperature of 600° C. for about 30 minutes, thereby causing a reaction between silicon and cobalt and forming a silicide film. Then, unreacted cobalt is removed by using a solution mixture (SPM) of a sulfuric acid and an aqueous hydrogen peroxide. Thereafter, a thermal treatment is performed at a temperature of 750° C. for about 30 seconds, thereby forming a cobalt silicide film serving as the gate electrode of each of the MISFETs and a part of each of the source/drain regions thereof. Since the thin oxide film 32 is interposed between the cobalt film 31 and the silicon layer in the memory region Rdram, a silicide reaction is suppressed so that a thin silicide film is formed therein.

In the logic region Rlogc, the gate electrode 10 of the pMISFET is therefore composed of the p-type polysilicon film 15 as the lower electrode and the silicide film 13 as the upper electrode and the gate electrode 11 of the nMISFET is composed of the n-type polysilicon film 16 as the lower electrode and the silicide film 13 as the upper electrode. The source/drain regions of the pMISFET are composed of the p-type source/drain diffusion layers 19 and the silicide films 12, while the source/drain regions of the nMISFET are composed of the n-type source/drain diffusion layers 17 and the silicide films 12.

In the memory region Rdram, on the other hand, the gate electrode 26 of each of the memory transistors is composed of the n-type polysilicon film 16 as the lower electrode and the relatively thin silicide film 23 as the upper electrode. The source/drain regions of the memory transistor are composed of the n-type source/drain diffusion layers 27 and the relatively thin silicide films 22.

Thereafter, the steps of forming an interlayer insulating film on the substrate, forming respective plugs reaching the source/drain regions, forming a DRAM capacitor on the interlayer insulating film in the memory region Rdram, and forming multilayer wiring insulated by the interlayer insulating film are subsequently performed, though the depiction thereof is omitted, whereby the memory embedded semiconductor device is formed. Although the present embodiment has formed the DRAM as the memory region, it is also possible to form a ROM or the like instead of the DRAM.

In accordance with the method for fabricating a memory embedded semiconductor device of the present embodiment, the diffusion of cobalt in the step illustrated in FIG. 2C is suppressed in the memory region Rdram by the oxide film 32 formed in the step illustrated in FIG. 2B so that a silicide reaction above the polysilicon film 26 and source/drain diffusion layers 27 of the memory transistor is suppressed. As a result, a relatively thick cobalt silicide film with a thickness of about 30 nm can be formed on each of the logic/drain diffusion layers 17 and 19 in the logic region Rlogc and a relatively thin cobalt silicide film with a limited thickness of about 20 nm can be formed on each of the source/drain diffusion layers 27 in the memory region Rlogc. As a result, the junction can substantially be deepened in each of the memory transistors so that a junction leakage to the substrate is suppressed in each of the memory transistors. In addition, the present embodiment allows the thickness of the silicide film 22 formed on each of the source/drain diffusion layers 27 of the memory transistors to be set as required by adjusting the thickness of the oxide film 32.

Thus, the fabrication method according to the present embodiment has performed silicidation with respect to each of the memory region Rdram and the logic region Rlogc by using a salicide technology with the memory region Rdram being covered with the oxide film. Since the oxide film suppresses the silicidation in the source/drain diffusion layers of the memory transistors, it becomes possible to reduce the thickness of the silicide film of each of the memory transistors, while increasing the thickness of the silicide film of each of the logic transistors. This allows a reduction in junction leakage in the memory transistor and the higher-speed operation thereof, while retaining the conventional performance of the logic transistors in the memory embedded semiconductor device.

In the case where the thickness of the silicide film is thus suppressed, the cobalt silicide film as the upper electrode of the gate electrode is also reduced in thickness so that there are concerns about the breakage of the silicide film at the gate electrode due to agglomeration. However, the present embodiment has suppressed the thickness of the cobalt silicide film only in each of the transistors in the memory region composed of DRAM memory cells or ROM memory cells each using only the gate electrode of one conductivity type (which is normally an n-type) and hence there is no boundary region between the n-type polysilicon and the p-type polysilicon so that a problem does not occur.

Although each of the first and second embodiments has provided the cobalt silicide film even over the polysilicon film included in the gate electrode, the present invention is not limited to such embodiments. The same effects as achieved in the foregoing individual embodiments are achievable by applying the present invention even to the case where the gate electrode of each of the MIS transistors is a polymetal gate, a metal gate, a polysilicon gate, or the like. In that case, an insulating film for suppressing a silicide reaction or the like may be provided appropriately in the uppermost layer of the gate electrode in the state shown in FIGS. 1A and 2 Å.

Thus, the memory embedded semiconductor device according to the present invention allows a reduction in leakage in each of the memory transistors and the higher-speed operation thereof, while retaining the performance of the logic transistors, and thereby implements a high-speed, large-capacity, and low-power memory embedded semiconductor device and a fabrication method therefor. Hence, the memory embedded semiconductor device according to the present invention is useful as a memory embedded semiconductor device comprising a memory such as a DRAM or a ROM and a high-speed CMOS logic circuit or the like.

What is claimed is:

1. A memory embedded semiconductor device comprising:
    a memory region having a memory transistor and a logic region having a logic transistor each provided in a common semiconductor substrate, wherein
    the logic transistor comprises:
    a first gate electrode formed on the semiconductor substrate;
    first source/drain diffusion layers each formed in the semiconductor substrate; and
    a first silicide film formed on the first source/drain diffusion layers, wherein
    the memory transistor comprises:
    a second gate electrode formed on the semiconductor substrate;
    second source/drain diffusion layers each formed in the semiconductor substrate;
    a second silicide film formed on the second source/drain diffusion layers to be thinner than the first silicide film; and
    a first ion implanted region formed in the second source/drain diffusion layers and beneath the second silicide film, wherein
    the first ion implanted region suppresses a silicide reaction when the second silicide film is formed, and wherein
    the first ion implanted region suppressing the silicide reaction is not formed in the first source/drain diffusion layers nor beneath the first silicide film.

2. The memory embedded semiconductor device of claim 1, wherein
    the first gate electrode has a first polysilicon film and a third silicide film formed on the first polysilicon film and
    the second gate electrode has a second polysilicon film and a fourth silicide film formed on the second polysilicon film to be thinner than the third silicide film.

3. The memory embedded semiconductor device of claim 1, wherein the first ion implanted region is formed by implantation of an impurity selected from nitrogen, argon, neon, arsenic, silicon, and germanium.

4. The memory embedded semiconductor device of claim 1, wherein the memory region is a DRAM or a ROM.

5. The memory embedded semiconductor device of claim 1, wherein a bottom of the first ion implanted region is located above a bottom of the second source/drain diffusion layers.

6. The memory embedded semiconductor device of claim 2, wherein the first ion implanted region is formed by implantation of an impurity selected from nitrogen, argon, neon, arsenic, silicon, and germanium.

7. The memory embedded semiconductor device of claim 2, wherein the second gate electrode has a second ion implanted region formed in the second polysilicon film and beneath the fourth silicide film.

8. The memory embedded semiconductor device of claim 7, wherein the second ion implanted region is formed by implantation of an impurity selected from nitrogen, argon, neon, arsenic, silicon, and germanium.

9. The memory embedded semiconductor device of claim 3, wherein a dose of the impurity that is implanted into the first ion implanted region is in a range of between $5 \times 10^{14}$ cm$^{-2}$ or more and $5 \times 10^{15}$ cm$^{-2}$ or less.

10. The memory embedded semiconductor device of claim 8, wherein a dose of the impurity that is implanted into the second ion implanted region is in a range of between $5\times10^{14}$ cm$^{-2}$ or more and $5\times10^{15}$ cm$^{-2}$ or less.

11. A memory embedded semiconductor device comprising:

a memory region having a memory transistor and a logic region having a logic transistor each provided in a common semiconductor substrate, wherein the logic transistor comprises:

a first gate electrode formed on the semiconductor substrate;

first source/drain diffusion layers each formed in the semiconductor substrate; and a first silicide film formed on the first source/drain diffusion layers, wherein the memory transistor comprises:

a second gate electrode formed on the semiconductor substrate;

second source/drain diffusion layers each formed in the semiconductor substrate;

a second silicide film formed on the second source/drain diffusion layers to be thinner than the first silicide film; and a first ion implanted region formed in the second source/drain diffusion layers and only beneath the second silicide film, and wherein the first ion implanted region suppresses a silicide reaction when the second silicide film is formed.

12. The memory embedded semiconductor device of claim 7, wherein the second ion implanted region suppressing the silicide reaction is not formed on the first polysilicon film nor beneath the third silicide film in the first gate electrode.

* * * * *